(12) United States Patent
Bellaouar et al.

(10) Patent No.: US 10,924,058 B2
(45) Date of Patent: *Feb. 16, 2021

(54) LOCAL OSCILLATOR DISTRIBUTION FOR A MILLIMETER WAVE SEMICONDUCTOR DEVICE

(71) Applicant: GLOBALFOUNDRIES INC., Grand Cayman (KY)

(72) Inventors: Abdellatif Bellaouar, Richardson, TX (US); Arul Balasubramaniyan, Plano, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 16/801,667

(22) Filed: Feb. 26, 2020

(65) Prior Publication Data

US 2020/0195195 A1 Jun. 18, 2020

Related U.S. Application Data

(63) Continuation of application No. 15/966,661, filed on Apr. 30, 2018, now Pat. No. 10,608,582.

(60) Provisional application No. 62/608,508, filed on Dec. 20, 2017.

(51) Int. Cl.
| | |
|---|---|
| *H03B 1/02* | (2006.01) |
| *H01P 5/16* | (2006.01) |
| *H03H 11/36* | (2006.01) |
| *H03B 5/12* | (2006.01) |
| *G06F 1/10* | (2006.01) |
| *H04B 1/38* | (2015.01) |
| *H04B 1/525* | (2015.01) |
| *H01P 5/12* | (2006.01) |

(52) U.S. Cl.
CPC ............ *H03B 1/02* (2013.01); *G06F 1/10* (2013.01); *H01P 5/16* (2013.01); *H03B 5/1203* (2013.01); *H03H 11/36* (2013.01); *H04B 1/38* (2013.01); *H04B 1/525* (2013.01); *H01P 5/12* (2013.01)

(58) Field of Classification Search
CPC ........ H03B 1/02; H03B 5/1203; H04B 1/525; H04B 1/38; H03H 11/36; H01P 5/16; H01P 5/12; G06F 1/10
See application file for complete search history.

(56) References Cited

U.S. PATENT DOCUMENTS

| | | |
|---|---|---|
| 2017/0085263 A1 | 3/2017 | Shao et al. |
| 2019/0081399 A1 | 3/2019 | Ku et al. |

OTHER PUBLICATIONS

Office Action dated Jun. 21, 2019 from co-pending parent U.S. Appl. No. 15/966,661; 11 pages.

*Primary Examiner* — Robert J Pascal
*Assistant Examiner* — Kimberly E Glenn
(74) *Attorney, Agent, or Firm* — Williams Morgan, P.C.

(57) ABSTRACT

A CMOS gain element is disclosed herein. Also disclosed herein are splitters, comprising the CMOS gain element, and local oscillator distribution circuitry comprising the splitters and the CMOS gain elements. Semiconductor devices comprising the local oscillator distribution circuitry may have smaller footprints and reduced power consumption relative to prior art devices.

15 Claims, 9 Drawing Sheets

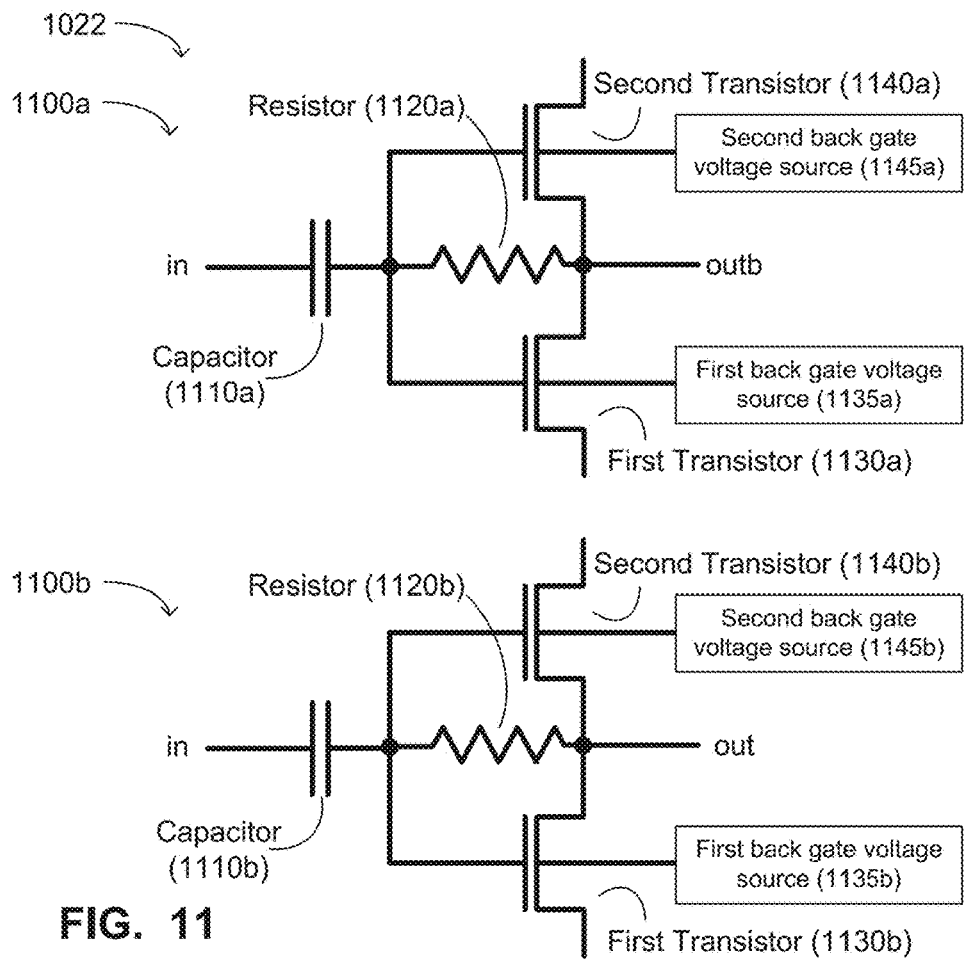
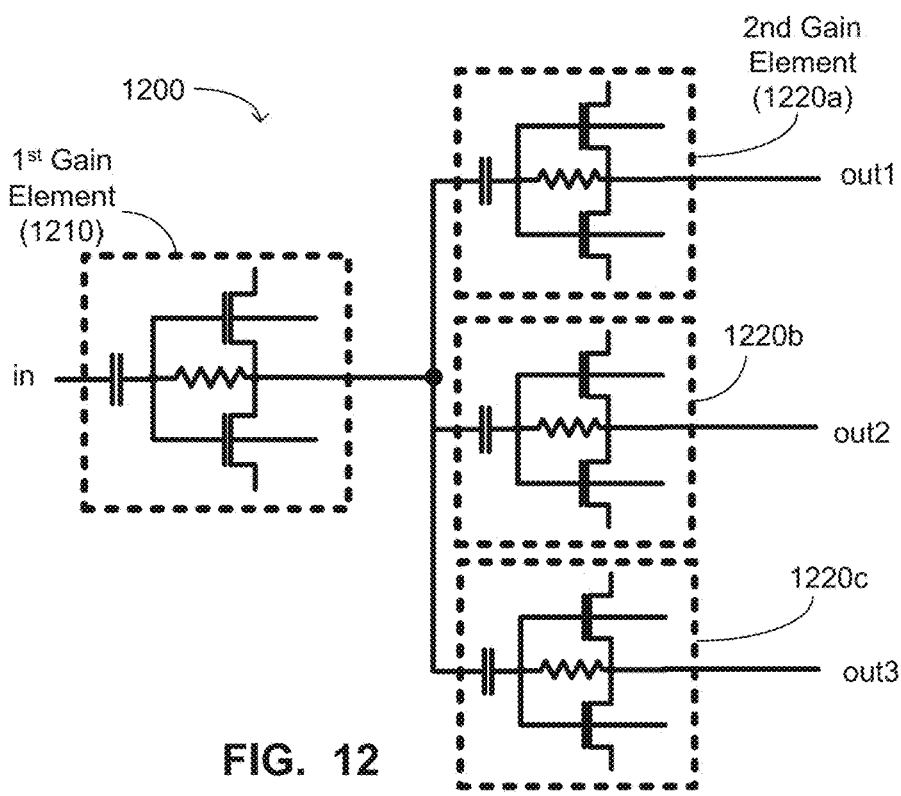
FIG. 11
FIG. 12

LOCAL OSCILLATOR DISTRIBUTION FOR A MILLIMETER WAVE SEMICONDUCTOR DEVICE

BACKGROUND OF THE INVENTION

Field of the Invention

Generally, the present disclosure relates to sophisticated semiconductor devices and, more specifically, to distribution of a mm-wave local oscillator signal, CMOS gain element, and semiconductor devices comprising the same.

Description of the Related Art

In an effort to maintain Moore's Law as a self-fulfilling prophecy, the semiconductor industry in recent years has sought to reduce the sizes of semiconductor devices. Also, in an effort to reduce operating expenses of semiconductor device, the semiconductor industry in recent years has sought to reduce the energy consumption of semiconductor devices. This is particularly a concern in semiconductor devices that operate in the millimeter wave (mm-wave) range.

Semiconductor devices that involve mm-wave applications include devices that operate based on the electromagnetic spectrum of radio band frequencies in the range of about 30 GigaHertz (GHz) to about 300 GHz. The mm-wave radio waves have a wavelength in the range of 1 millimeter (mm) to about 10 mm, which corresponds to a radio frequency of 30 GHz to about 300 GHz. This band of frequencies is sometimes referred to as extremely high frequency (EHF) frequency band range. Examples of applications of mm-wave application include radar devices, high-speed communication devices (e.g., wireless gigabit (WiGig) devices), etc. Radar devices have been implemented in various applications such as vehicle safety and automation applications.

Implementing mm-wave applications produces many challenges when designing circuits for these applications. A number of device types that involve mm-wave applications require the splitting or dividing of signals. For example, in semiconductor devices, such as automotive radars and wireless telephones meeting the 5G standard, which comprise a plurality of transmitter and/or receiver antennas, a timing signal provided by an oscillator may be split to provide a timing signal to each antenna.

Because splitting a signal reduces the output signal's power, splitting requires power dividers to maintain the power of each split signal equal to the power of the input signal. Also, given that power is lost with distance of signal transmission, repeaters may be needed to boost the signal power.

Known power dividers include the Wilkinson and Gysel power dividers. The Wilkinson power divider, however, has a relatively large footprint and, because it is a passive divider, suffers from signal loss and accordingly requires amplification. Use of an amplifier with the Wilkinson power divider entails relatively large energy consumption characteristics. Other power dividers, such as the Gysel power divider, and repeaters known in the art also have relatively large footprints and relatively large energy consumption characteristics. Power dividers and repeaters known in the art at mm-wave frequencies require impedance matching elements that include transformers and related circuits to optimally function. The inclusion of transformers and related circuits increases silicon die area and therefore cost.

For example, a three-channel automotive radar receiver known in the art from a first manufacturer consumes about 790 mW and a two-channel automotive radar known in the art from the first manufacturer consumes about 858 mW, which are relatively large power consumptions.

Accordingly, it would be desirable to have a power divider and/or a repeater with a relatively small footprint and a relatively small energy consumption.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to CMOS gain elements and apparatus comprising such gain elements. CMOS gain elements may allow power dividers and repeaters to have relatively small footprints and relatively small energy consumptions.

In one embodiment, the present disclosure relates to a gain element, comprising: a first circuit comprising: a capacitor; a resistor, a first transistor, and a second transistor in parallel; wherein one of the first transistor and the second transistor is an NMOS transistor, and the other of the first transistor and the second transistor is a PMOS transistor; and a second circuit comprising: a capacitor; a resistor, a first transistor, and a second transistor in parallel; wherein one of the first transistor and the second transistor is an NMOS transistor, and the other of the first transistor and the second transistor is a PMOS transistor.

In one embodiment, the present disclosure relates to a splitter, comprising: a first gain element in series with a plurality of second gain elements, wherein the plurality of second gain elements are in parallel; wherein the first gain element and each second gain element each comprise: a first circuit comprising: a capacitor; a resistor, a first transistor, and a second transistor in parallel; wherein one of the first transistor and the second transistor is an NMOS transistor, and the other of the first transistor and the second transistor is a PMOS transistor; and a second circuit comprising: a capacitor; a resistor, a first transistor, and a second transistor in parallel; wherein one of the first transistor and the second transistor is an NMOS transistor, and the other of the first transistor and the second transistor is a PMOS transistor.

In one embodiment, the present disclosure relates to a semiconductor device, comprising: an oscillator configured to provide a first signal having a wavelength $\lambda$; a first splitter configured to receive the first signal and provide a second signal and a third signal, wherein the second signal and the third signal each have the wavelength $\lambda$; a first line configured to carry the second signal provided by the first splitter; a second line configured to carry the third signal provided by the first splitter; a transmitter splitter configured to receive the second signal via the first line and provide a plurality of transmitter signals, wherein each transmitter signal has the wavelength $\lambda$; and a receiver splitter configured to receive the second signal via the second line and provide a plurality of receiver signals, wherein each receiver signal has the wavelength $\lambda$; wherein the first line has a length from $\lambda/4$ to $\lambda/32$ and the second line has a length from $\lambda/4$ to $\lambda/32$. The first splitter, the transmitter splitter, and the receiver splitter may each be a splitter referred to above. The semiconductor device may also comprise one or more repeaters, wherein each repeater may be a gain element referred to above.

BRIEF DESCRIPTION OF THE DRAWINGS

The disclosure may be understood by reference to the following description taken in conjunction with the accompanying drawings, in which like reference numerals identify like elements, and in which:

FIG. 11 illustrates a gain unit, in accordance with embodiments herein;

FIG. 12 illustrates a splitter, in accordance with embodiments herein; and

Figure 1:
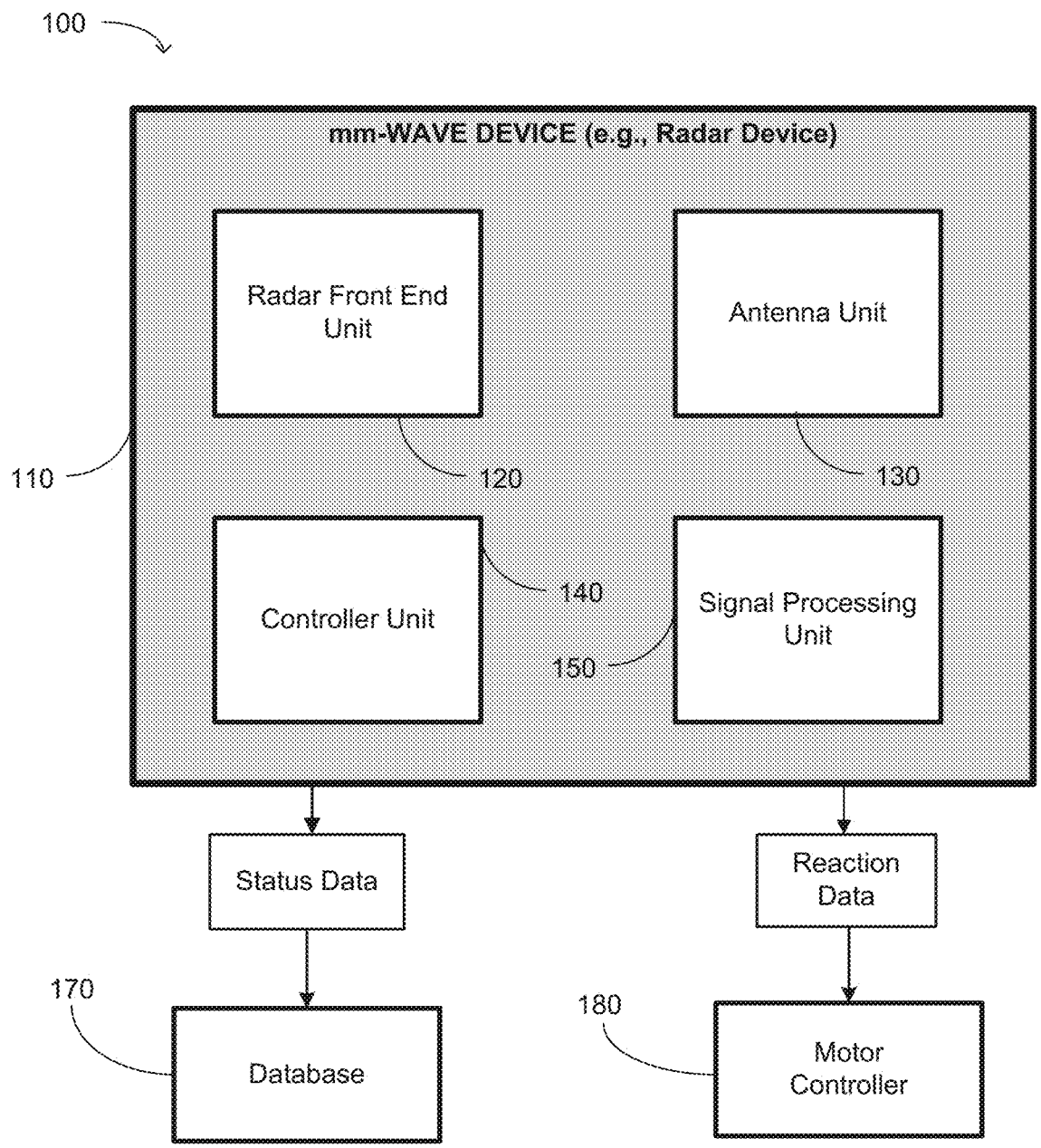
FIG. 1 illustrates a stylized block diagram representation of a radar system, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to any absolute scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for distribution of local oscillator signals to transmitters and receivers of a mm-wave system, e.g., a radar system, with low power consumption and small footprint, and without the use of Wilkinson, Gysel, or other power dividers.

For ease of illustration, embodiments herein is depicted within the context of a radar device, however, those skilled in the art would readily appreciate that the concepts disclosed herein may be implemented in other types of devices, such as high-speed communication devices, network devices, etc. Turning now to FIG. 1, a stylized block diagram representation of a radar system, in accordance with embodiments herein, is illustrated.

A system 100 may comprise a millimeter wave (mm-wave) device 110, a database 170, and a motor controller 180. The mm-wave device 110 may be a radar device, a wireless communication device, a data network device, a video device, or the like. For illustrative purposes and for the sake of clarity and ease of description, the mm-wave device 110 is described in the context of a radar application; as such, the mm-wave device 110 may be often referred to below as a radar device 110. However, those skilled in the art having benefit of the present disclosure would appreciate that the concepts described herein may be applied to a variety of type of mm-wave applications, including vehicle applications using radar signals, wireless network applications, data network applications, video and audio applications, etc.

The radar device 110 is capable of transmitting a radar signal, receiving a reflected signal resultant from the reflection of the radar signal, processing the reflected signal, and providing status data and/or reaction data for performing one or more actions based on the reflected signal. In one embodiment, the status data may include status of the target from which the reflection was received. Further, a motor controller 180 may control operations of one or more motors. Examples of motors may include devices that performing braking functions, steering functions, gear-shifting functions, accelerating functions, warning functions, and/or other actions relating to the operations of a road vehicle, an aircraft, and/or a watercraft. The motor controller 180 may use the reaction data and/or the status data to perform these control functions. The motor controller 180 may comprise one or more controllers that are capable of controlling a plurality of devices that perform the various operations of a road vehicle, an aircraft, and/or a watercraft.

The radar device 110 may comprise a radar front end unit 120, an antenna unit 130, a controller unit 140, and a signal processing unit 150. The radar front end unit 120 may comprise a plurality of components, circuit, and/or modules, and is capable of sending, receiving, processing, and reacting to radar signals. In one embodiment, the radar device 110 may be encompassed into a single integrated circuit (IC) chip. In some embodiments, the radar device 110 may be formed on a plurality of integrated circuits that are positioned on a single IC chip. In other embodiments, radar device 110 may be formed on single integrated circuit, which is shrouded into an IC chip.

The radar front end unit 120 is capable of providing a radar signal. In one embodiment, the frequency range of the radar signals processed by the radar device 110 may be in the range of about 10 GHz to about 90 GHz. The radar front end unit 120 is capable of generating a radar signal at a predetermined frequency range and directing the radar signal at a predetermined target area. The radar front end unit 120 is also capable of receiving a reflected signal based on the reflection of radar signal, and processing the reflected signal to determine a plurality of characteristics, such as the direction of a target, the speed of a target, the relative distance of a target, and/or the like. A more detailed description of the radar front end unit 120 is provided in FIG. 3 and accompanying description below.

In an alternative embodiment, the 120 may be a network communications front end unit, instead of a radar front end unit. In this embodiment, instead of receiving, transmitting, and/or processing radar signals, the device 110 may process network communications for various types of communication applications, such as packet data network communications, wireless (e.g., cellular communications, IEEE 802.11ad WiGig Technology, etc.), data communications, etc. The concepts disclosed herein in the context of radar applications may also be utilized for other types of applications, such as network communications, wireless communications, high-definition video applications, etc.

Continuing referring to FIG. 1, the antenna unit 130 may also comprise a transmission antenna and/or a receiver antenna. Further, each of the transmission and receiver antennas may comprise sub-portions to form an array of antennas. The transmission antennas are used for transmitting the radar signal, while the receiver antennas are used for receiving reflected signals resulting from reflections of the radar signal. A more detailed description of the antenna unit 130 is provided in FIG. 7, and accompanying description below.

Continuing referring to FIG. 1, the radar device 110 may also comprise a signal processing unit 150. The signal processing unit is capable of performing various analog and/or digital processing of the signals that are transmitted and/or received by the radar device 110. For example, the radar signal transmitted by the radar device may be amplified prior to its transmission. Further, the reflected signal received by the radar device 110 may be sent through one or more analog filter stages. The reflected signals may then be converted/digitized into a digital signal by one or more analog-to-digital converters (A/D converters) in the signal processing unit 150. Digital signal processing (DSP) may be performed on the digitized signal. A more detailed description of the signal processing unit 150 is provided in FIG. 6 and accompanying description below.

Continuing referring to FIG. 1, the radar device 100 may also comprise a controller unit 140. The controller unit 140 may perform various control operations of the radar device 110. These functions include generating a radar signal, transmitting the radar signal, receiving a reflected signal, processing the reflected signal, and perform one or more determinations of the location, direction, speed, or other parameters of a target based on the reflected signal. The controller unit 140 is capable of generating the status data and the reaction data described above.

Figure 2:
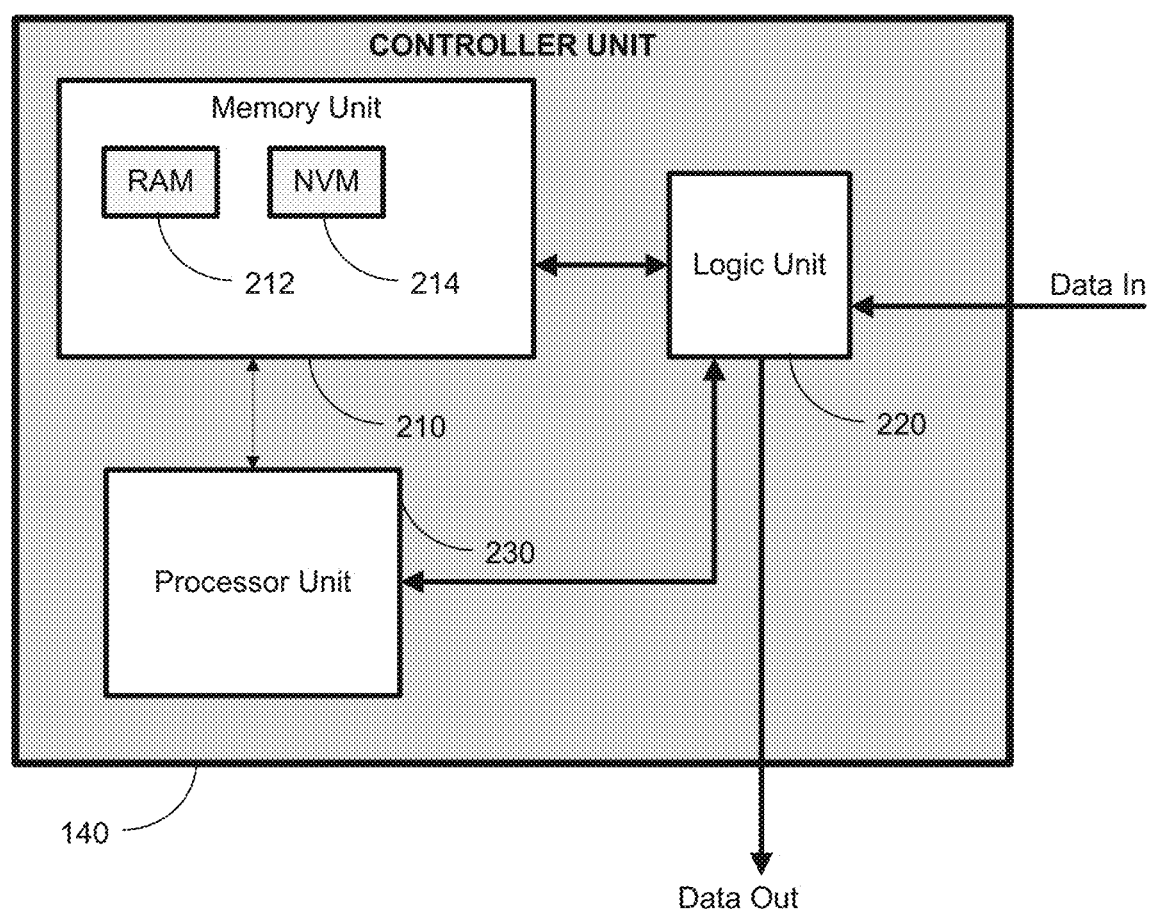
FIG. 2 illustrates a stylized block diagram description of the controller unit 140, in accordance with embodiments herein.

Turning now to FIG. 2, a stylized block diagram description of the controller unit 140, in accordance with embodiments herein, is provided. The controller unit 140 may comprise a processor unit 230 capable of controlling various function of the radar device 110. The processor unit 230 may comprise a microprocessor, a microcontroller, a field programmable gate array (FPGA), an application-specific integrated circuit (ASIC), and/or the like.

The controller unit 140 may also comprise a logic unit 220. The logic unit 220 may comprise a circuit that is capable of performing various logic operations, receiving data, and/or performing interface functions with respect to input data (data_in) and output data (data_out). The signal, data_in, may represent data derived from processing and analyzing the reflected signal. The signal, data_out, may represent data generated for performing one or more tasks as a result of the radar signal transmission and the reflected signal. For example, the data_out signal may be used to perform an action (e.g., braking, steering, accelerating, providing warnings, etc.) based on the radar signal transmission and reflected signal reception.

The controller unit 140 may also comprise a memory unit 210. The memory unit 210 may comprise a non-volatile memory 214 and a RAM 212. The non-volatile memory 214 may comprise FLASH memory and/or programmable read only (PROM) devices. The memory unit 210 is capable of storing operation parameters, program files, etc., for controlling various operations of the radar device 110. Further, the memory unit 210 may store the status data and the reaction data described above. The memory unit 210 may also store data that may be used to program any FPGA devices in the radar device 110. As such, the memory unit 210 may be subdivided into a program data memory, a status data memory, and a reaction data memory. This subdivision may be performed logically, physically, or based on both, logical and physical subdivisions.

Figure 3:
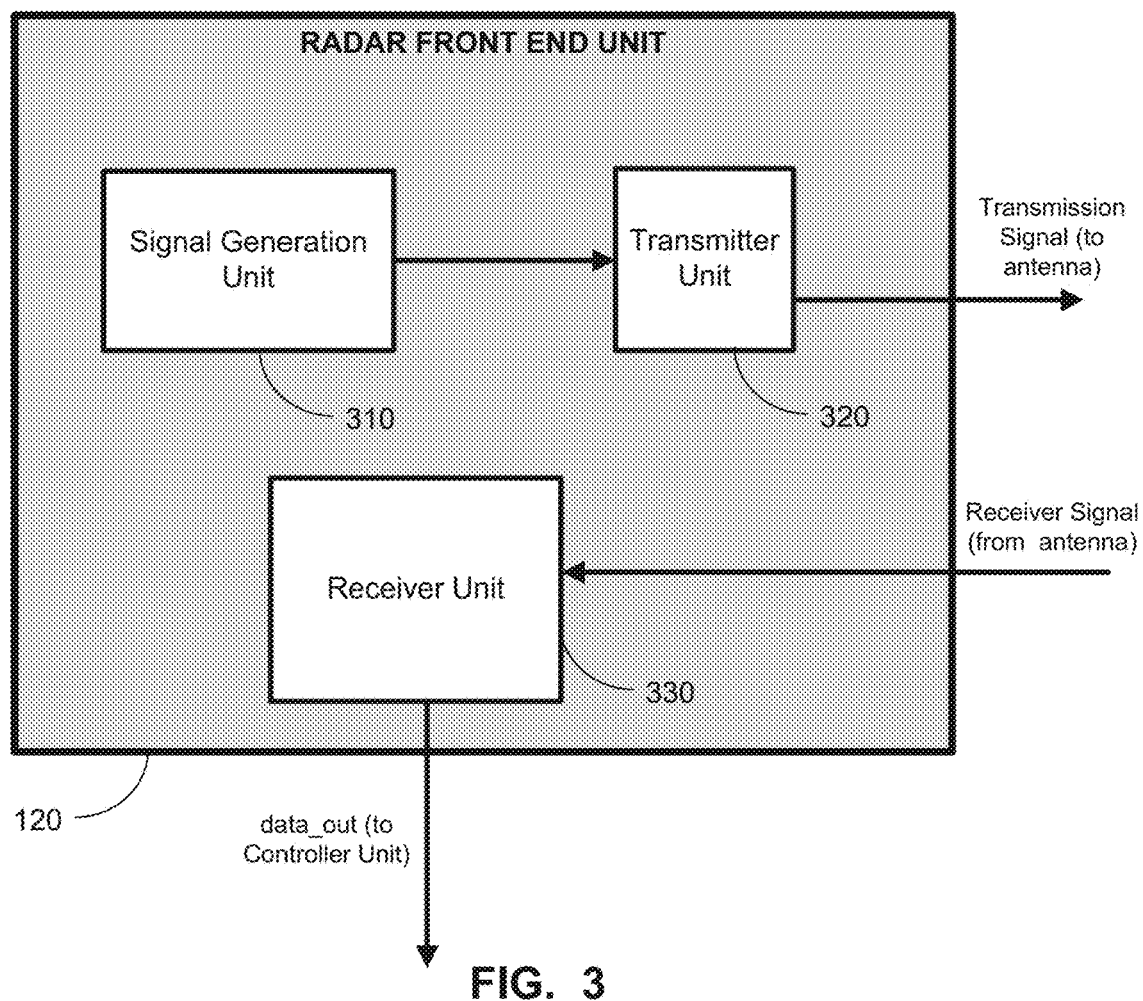
FIG. 3 illustrates a stylized block diagram depiction of the radar front end unit of FIG. 1, in accordance with embodiments herein, is illustrated.

Turning now to FIG. 3, a stylized block diagram depiction of the radar front end unit 120, in accordance with embodiments herein, is illustrated. The radar front end unit 120 may comprise a signal generation unit 310, a transmitter unit 320, and a receiver unit 330. The signal generation unit 310 is capable of generating a radar signal at a predetermined frequency. For example, a signal in the range of about 70 GHz to about 85 GHz may be generated. The signal generation unit 310 is capable of providing a radar signal for transmission. More detailed description of the signal generation unit 310 is provided below.

Continuing referring to FIG. 3, a signal for processing and transmission is provided by signal generation unit 310 to the transmitter unit 320. The transmitter unit 320 may comprise a plurality of filters, signal conditioning circuits, buffer, amplifiers, etc. for processing the signal from the signal generation unit 310. The transmission unit 320 provides a radar signal to be transmitted to the antenna unit 130.

Figure 4:
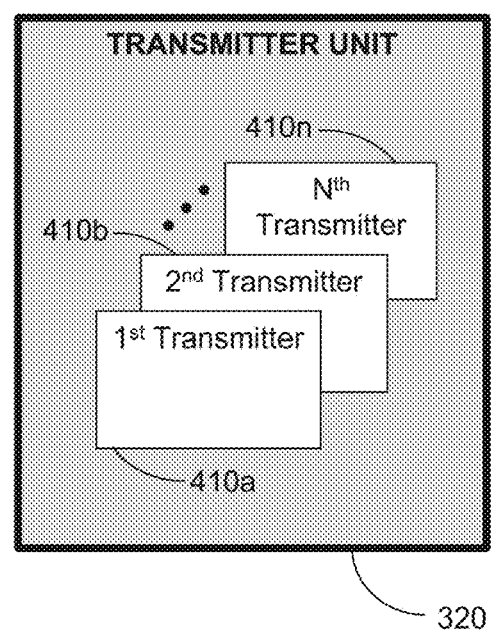
FIG. 4 illustrates a stylized block diagram of the transmitter unit of FIG. 3, in accordance with embodiments herein.

FIG. 4 illustrates a stylized block diagram of the transmitter unit 320, in accordance with embodiments herein. Referring simultaneously to FIGS. 3 and 4, the transmitter unit 320 may comprise a plurality of similar transmitters, i.e., a 1$^{st}$ transmitter 410a, a 2$^{nd}$ transmitter 410b, through an N$^{th}$ transmitter 410n (collectively "410"). In one embodiment, the 1$^{st}$ through N$^{th}$ transmitters 410 may each process a single signal from the signal generation unit 310 and provide an output transmission signal to one or more antennas. In another embodiment, the signal generation unit 310 may provide a plurality of signals to the through N$^{th}$ transmitters 410. For example, the signal generation unit 310 may provide a signal transmit signal for each transmitter 410, or alternatively, a 1$^{st}$ transmit signal for a first set of transmitters 410 and a 2$^{nd}$ transmit signal for a second set of transmitters 410.

Continuing referring to FIG. 3, a received signal (i.e., a reflected signal resulting from a reflection of the radar signal directed towards a target area) is provided to the receiver unit 330. The receiver unit 330 is capable of receiving the processed received signal from the signal processing unit 130. The receiver unit 330 is capable of performing analog-to-digital (A/D) conversion, signal buffering, DSP, etc. In some embodiments, the signal processing unit 130 may perform A/D conversions and DSP; however, in other embodiments, these tasks may be performed by the receiver unit 330. The receiver unit 330 is capable of directing the output signal, data_out, to the controller unit 140.

Figure 5:
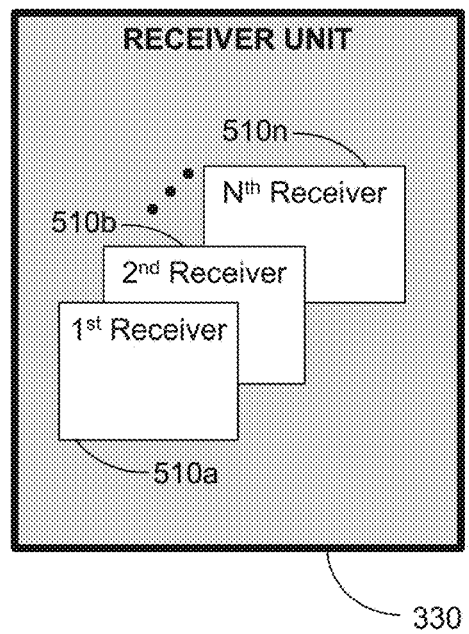
FIG. 5 illustrates a stylized block diagram of the receiver unit of FIG. 3, in accordance with embodiments herein.

FIG. 5 illustrates a stylized block diagram of the receiver unit 320, in accordance with embodiments herein. Referring simultaneously to FIGS. 3 and 5, the receiver unit 320 may comprise a plurality of similar receivers, i.e., a 1$^{st}$ receiver 510a, a 2$^{nd}$ receiver 510b, through an N$^{th}$ receiver 510n (collectively "510"). In one embodiment, the 1$^{st}$ through N$^{th}$ receivers 510 may each process a single signal from the signal generation unit 310 and provide the signal to the controller unit 140. In another embodiment, the may provide a plurality of signals to the through N$^{th}$ receiver 510. For example, the antenna unit 130 may provide a signal to each receiver 510, or alternatively, a 1$^{st}$ receiver signal for a first set of receivers 510, and a 2$^{nd}$ receiver signal for a second set of receivers 510.

Figure 6:
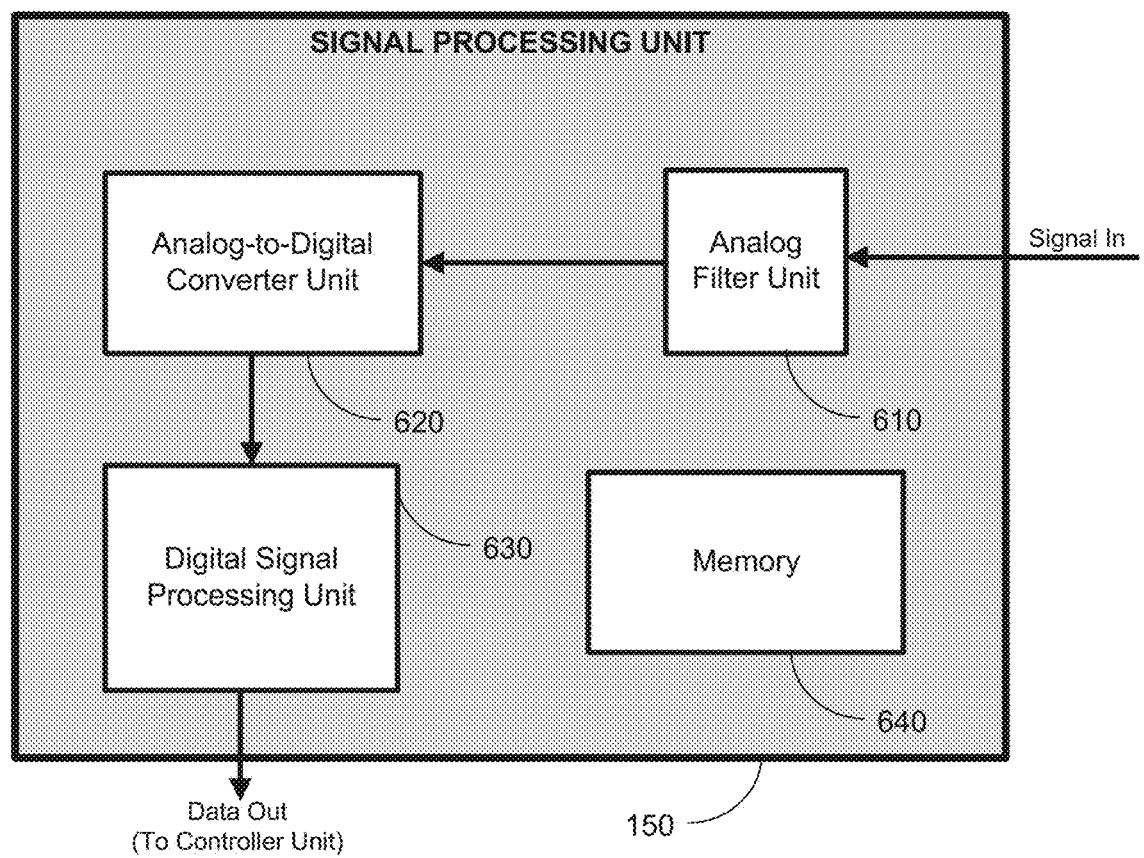
FIG. 6 illustrates a stylized block diagram depiction of the signal processing unit of FIG. 1, in accordance with embodiments herein.

Turning now to FIG. 6, a stylized block diagram depiction of the signal processing unit 150, in accordance with embodiments herein is illustrated. The signal processing unit 150 may comprise an analog filter unit 610, an A/D converter 620, a DSP unit 630, and a memory 640. The analog filter unit 610 is capable of performing filtering as well as amplification of the analog mm-wave signal received by the signal processing unit 150. Noise filtering may be performed by the analog filter unit 610 prior to performing amplification of the analog mm-wave signal.

The A/D converter 620 is capable of converting the filtered and/or amplified analog signal into a digital signal. The A/D converter 620 may be capable of performing conversions of predetermined or varying accuracy. For example, the A/D converter 620 may have an accuracy of 12-bit, 24-bit, 36-bit, 48-bit, 64-bit, 96-bit, 128-bit, 256-bit, 512-bit, 1024-bit, or greater accuracy. The converted digital mm-wave signal is provided to the DSP unit 630.

The DSP unit 630 is capable of performing a variety of DSP operations on the digital mm-wave signal. For example, digital filtering of the digital mm-wave may be performed by the DSP unit 630. As an example, signal components outside of a predetermined frequency range, e.g., 70 GHz to about 85 GHz may be filtered to be of lower amplitude. In other instances, mathematical functions, such as Fast Fourier Transform (FFT), may be performed on the mm-wave signal. The processed digital output from the DSP unit 630 may be sent to the controller unit 140 for analysis. In other instances, the digital output may be buffered or stored into a memory 640. In some cases, the memory 610 may be a first-in-first-out (FIFO) memory. In other cases, the processed digital output from the DSP unit 630 may be stored in the memory unit 210 of the controller unit 140.

Figure 7:
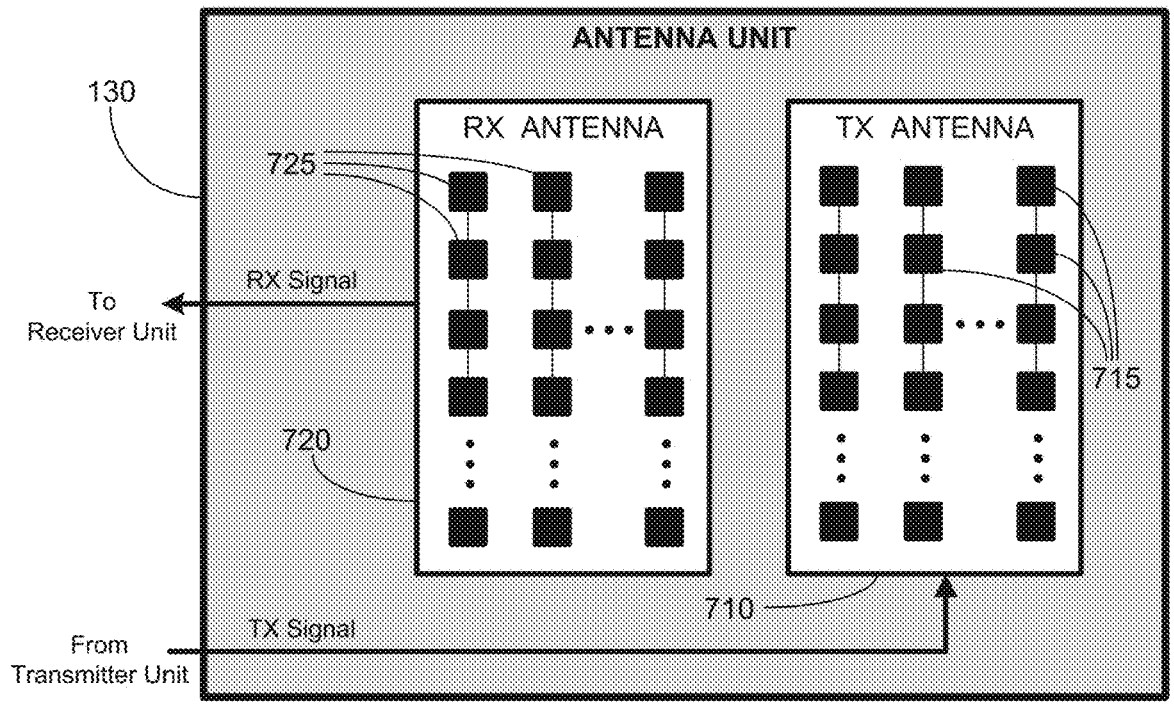
FIG. 7 illustrates a stylized block diagram depiction of the antenna unit of FIG. 1, in accordance with embodiments herein.

Turning now to FIG. 7, a stylized block diagram depiction of the antenna unit of FIG. 1, in accordance with embodiments herein, is illustrated. Millimeter-wave signals to be sent out (e.g., radar signals, network data signals, wireless communication signals, etc.) may be provided by the transmitter unit 320 (FIG. 3) to the transmit antenna 710. In one embodiment, the transmit antenna 710 may comprise a plurality of transmit antenna portions 715. The transmit antenna portions 715 are arranged in a predetermined pattern, e.g., an array matrix, as exemplified in FIG. 7.

Millimeter-wave signals that are to be received (e.g., radar signals, network data signals, wireless communication signals, etc.) may be captured by the receive antenna 720. The receive antenna 720 provides the received mm-wave signals to the receiver unit 330 (FIG. 3). In one embodiment, the receive antenna 720 may comprise a plurality of receive antenna portions 725. The receive antenna portions 725 are also arranged in a predetermined pattern, e.g., an array matrix exemplified in FIG. 7.

Figure 8:
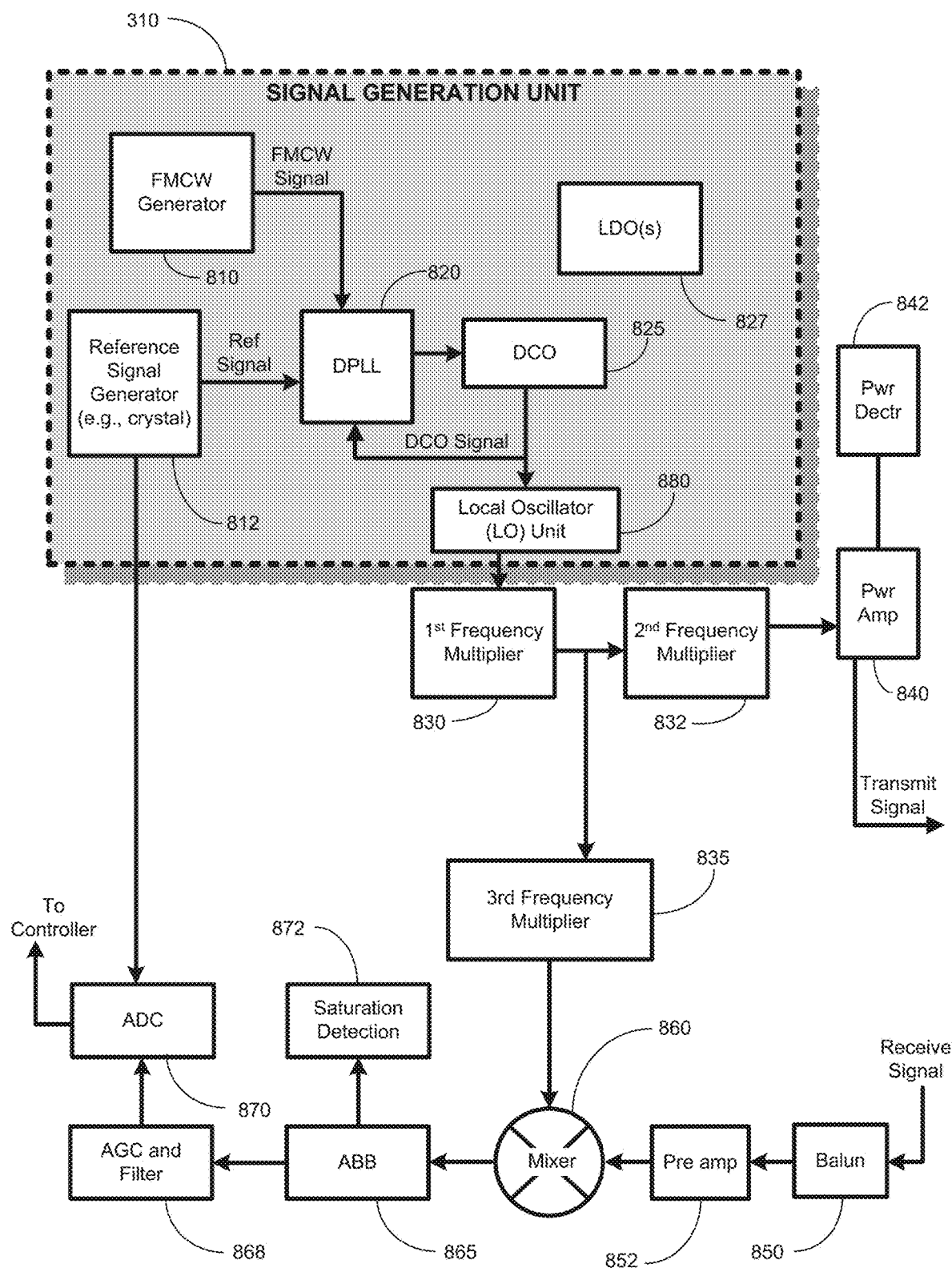
FIG. 8 illustrates a stylized block diagram depiction of an exemplary radar application of the system of FIG. 1, in accordance with embodiments herein.

Turning now to FIG. 8, a stylized block diagram depiction of an exemplary radar application of the system 100, in accordance with embodiments herein is illustrated. FIG. 8 shows an exemplary implementation of the signal generation unit 310 (FIG. 3) and exemplary portions of the transmitter unit 320 and the receiver unit 330.

The signal generation unit 310 generates a signal (e.g., a radar signal) that is to be transmitted and directed to a target region, e.g., toward the area in front of a vehicle. A frequency modulated continuous wave (FMCW) generator 810 provides an mm-wave signal in the range of about 20 GHz. The FMCW generator 810 may be arranged to provide a low speed ramp (LSR) signal or a high speed ramp (HSR) signal. In alternative embodiment, the FMCW generator 810 may be replaced by a pulse train generator for application of a Pulse Doppler radar system.

Further, a reference signal is provided by a reference signal generator 812. The mm-wave signal from the FMCW generator 810 and the reference signal are both sent to a digital phase lock loop (DPLL) 820. The DPLL 820 locks the phase of the mm-wave signal from the FMCW generator 810 with the phase of the reference signal. The output of the DPLL 820 is sent to a digitally controlled oscillator (DCO) 825. The output of the DCO is fed back to the DPLL. Thus, the DCO 825 is capable of providing a stable DCO signal. The DCO signal is, in one embodiment, about 20 GHz. A plurality of low dropout (LDO) regulators 827, which may comprise a reference voltage, an error amplifier, a feedback voltage divider, and a plurality of pass elements, e.g., transistors. The LDO regulators 827 are arranged to provide a regulated voltage supply to the various portions of the circuit of FIG. 8. Generally, this regulated voltage supply is lower than the supply voltage.

The signal generation unit 310 may also comprise one or more local oscillator (LO) units 880. The local oscillator unit 880 may be arranged to provide an oscillator chain for distributing mm-wave signals to a plurality of transmitters and receivers. In some embodiments, the digitally controlled, phase-locked output mm-wave signal (i.e., output of the DCO 825) based on the FMCW signal and the reference signals may be provided by the local oscillator unit 880. The local oscillator unit 880 may provide mm-wave signals to the transmitter unit 320 for transmitting mm-wave signals, and/or to the receiver unit 330 to perform mixer functions. The local oscillator unit 880 may comprise a phase lock loop and a local oscillator distribution circuitry. A more detailed description of the local oscillator distribution circuitry is provided in FIGS. 9-11 and accompanying description below.

In some embodiments, it is desirable to transmit an 80 GHz signal, for example in a vehicle radar application. The DCO 825 provides a 20 GHz signal, therefore, two frequency doublers may be used to multiply the 20 GHz signal to provide a 40 GHz, and then multiply the 40 GHz signal to provide an 80 GHz signal to transmit. Accordingly, a 1$^{st}$ frequency multiplier 830 is used to double the 20 GHz signal to produce a 40 GHz signal. A 2$^{nd}$ frequency multiplier 832 is used to double the 40 GHz signal to produce an 80 GHz signal. The output of the 2$^{nd}$ frequency multiplier 832 is provided to a power amplifier 840. The output of the power amplifier 840 may be provided to the antenna for transmission. A power detector 842 may detect the power of the output of the power amplifier 840, and may prompt feedback adjustments in order to maintain a predetermined power level of the transmit signal. In some embodiments, the transmitted signal may be 77 GHz signal, and the frequency of the DCO 825 is adjusted accordingly to provide the 77 GHz signal at the output of the 2$^{nd}$ frequency multiplier 832 and/or the 3$^{rd}$ frequency multiplier 835.

A received signal may be processed by the circuit shown in FIG. 8. The received signal, e.g., from the signal processing unit 150, is provided to a balun circuit 850. The balun may comprise a transformer, and provides a differential output to a pre-amplifier 852. After performing a pre-amplification of the received signal, the output from the pre-amplifier 852 is provided to the mixer 860.

The mixer 860 is capable of combining the received signal from the pre-amplifier 852, with an output signal from a 3$^{rd}$ frequency multiplier 835. The output of the 3$^{rd}$ frequency multiplier 835 is the doubled version of the 40 GHz signal from the 1$^{st}$ frequency multiplier. That is, the output of the 3$^{rd}$ frequency multiplier 835 is an 80 GHz reference signal. The mixer 860 receives the reference 80 GHz signal and in one embodiment, multiplies it to the received signal, which is a reflected or echo signal resulting from the reflection from the transmitted signal. The output of the mixer may be used to determine various characteristics regarding an object(s) from which the transmitted signal was reflected, including direction, location, trajectory, and/or speed of the object.

The output of the mixer 860 is provided to an analog baseband (ABB) unit 865. The mixer 860 converts the incoming mm-wave signal using a local oscillator (which may be provided by local oscillator unit 880) to lower the frequency of the signal. The analog baseband unit 865 can include a transimpedance amplifier (TIA), which may include one or more filters and/or other low frequency gain stages. The output of the ABB unit 865 is provided to an automatic gain control (AGC) and filter circuits 868. A saturation detection circuit 872 may detect any saturation of the signal processed by the AGC/filter circuits 868 and perform responsive adjustment. The output of the AGC/filter circuits 868 is provided to an A/D converter 870. The output of the A/D converter 870 may be provided to the controller unit 140 for further processing and responsive actions, such as digital signal processing (DSP).

Figure 9:
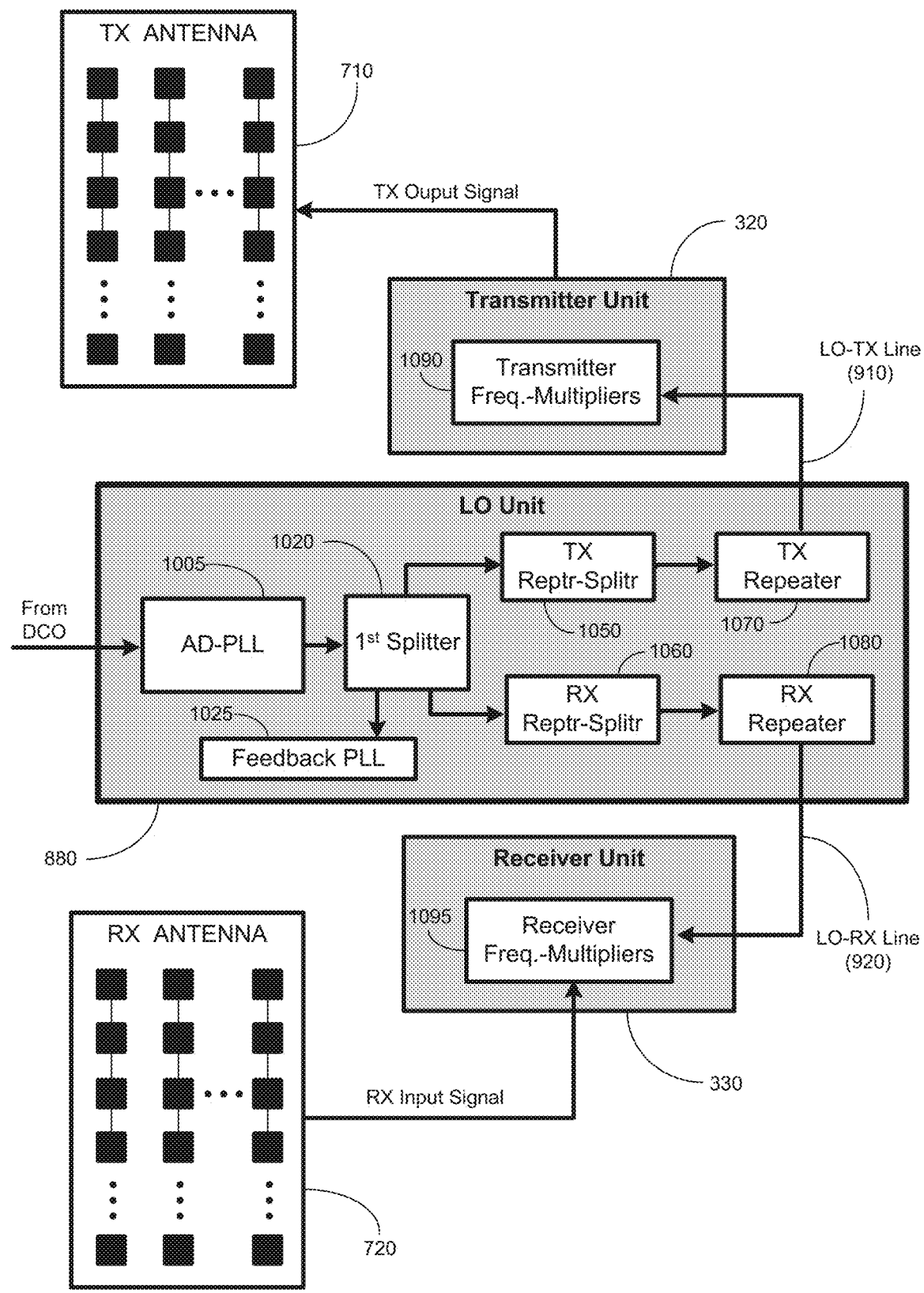
FIG. 9 illustrates a stylized depiction of a local oscillator unit, in accordance with embodiments herein.

FIG. 9 illustrates a stylized depiction of a local oscillator unit, in accordance with embodiments herein. The LO unit 880 depicted in FIG. 9 comprises a LO distribution chain utilizing splitters and repeaters, which can be scaled to accommodate various technology nodes. The repeaters and splitters of the LO unit 880 provide for distributing relatively smaller gain stages, thereby providing for avoiding a single large gain stage. This may result in improved stability at mm-wave frequencies.

The LO unit 880 may receive an mm-wave signal from the DCO 825. The DCO signal is sent to an analog-digital phase lock loop (AD-PLL) 1005. Upon performing a phase locking function, the phase-locked signal is provided to a 1$^{st}$ splitter 1020. The 1$^{st}$ splitter 1020 may provide three outputs: a feedback phase lock loop signal to a feedback phase lock loop 1025; a transmission signal to a transmission (TX) repeater-splitter 1050; and a receiver signal to a receiver (RX) repeater-splitter 1060. The repeater-splitters 1050, 1060 are comprised of gain elements, wherein the splitting of the signals may be performed without using dividers, but using signal lines that connect between elements of the LO unit 880, wherein the lengths of the signal lines are a predetermined fraction of the wavelength, $\lambda$ of the mm-wave signal (e.g., /4 to $\lambda$/32), and in one embodiment, $\lambda$/10).

The output from the TX repeater-splitter 1050 is provided to a TX repeater 1070 after a line length that is the predetermined fraction of the wavelength (e.g., $\lambda$/10). Likewise, the output from the RX repeater-splitter 1060 is provided to an RX repeater 1080 after a line length that is the predetermined fraction of the wavelength (e.g., $\lambda$/10). The output of the TX repeater 1070, i.e., a TX output signal, is provided to one or more transmitter frequency multipliers 1090 associated with the transmitter unit 320 via a LO-TX line 910. The output of the RX repeater 1080 is provided to one or more receiver frequency multipliers 1090 associated with the receiver unit 330, via a LO-RX line 920. The TX-LO line 910 and the RX-LO line 920 are of a length that is the predetermined fraction of the wavelength (e.g., $\lambda$/10).

The transmitter unit 320 may comprise other circuitry that provides the signal to be transmitted to the TX antenna 710. The receiver unit 330 may also comprise of various circuitry, such as a mixer (as exemplified above with regard to FIG. 8), to which the receiver frequency multipliers 1095 provide an mm-wave signal. The output of the receiver frequency multiplier 330 may be provided to a mixer, along with the RX input signal from the RX antenna 720 to perform a mixing function.

The various repeater and splitter stages described in FIG. 9 may be comprised of gain elements comprising CMOS circuitry. The signal from the DCO 825 may be of a frequency such that the length of the LO lines between the elements of the LO unit 880 may be segmented to a fraction of the wavelength, $\lambda$ (e.g., $\lambda$/4 to $\lambda$/32). In some embodiments, low and variable gain CMOS elements may be used to form the repeater and splitter circuitry of the LO unit 880. The frequency multiplication described above may be an integer, e.g., 2, 3, 4, 5, . . . . In one embodiment, the integer 3 may be avoided as to reduce the third harmonic, which may be stronger than the second harmonic of the mm-wave signal.

Figure 10:
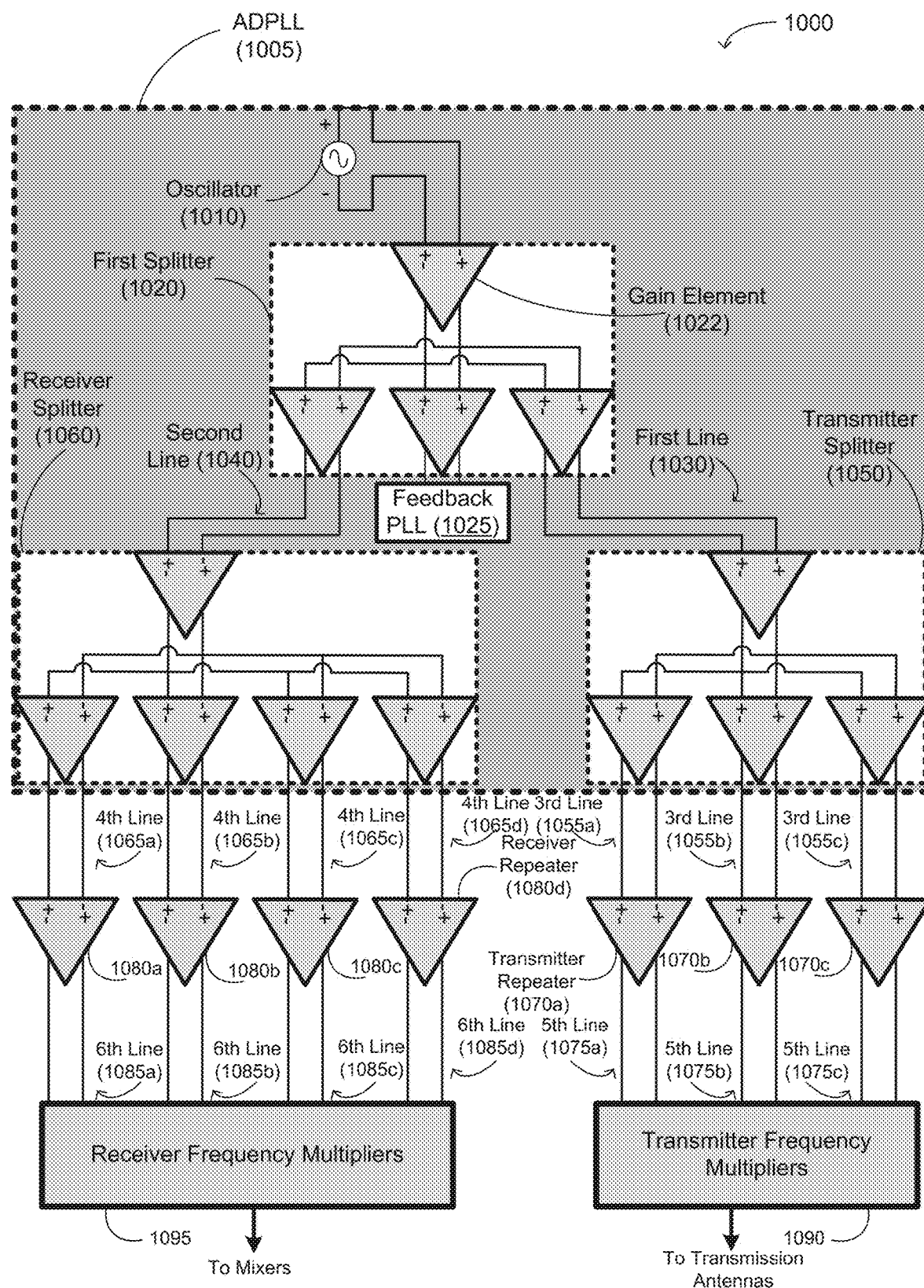
FIG. 10 illustrates a semiconductor device, in accordance with embodiments herein.

Further, the implementation of the LO unit 880 may also provide for reducted area usage, and improved isolation between the transmission lines and the receiver lines. The output from the TX frequency multiplier 1090 may be provided to power amplifiers for transmission via the TX antenna 710. The output from the receiver frequency multipliers 1095 may be provided to a mixer along with the received RX input signal. FIG. 10 illustrates a stylized depiction of a semiconductor device having a local oscillator distribution circuitry 1000 associated with the LO unit 880, in accordance with embodiments herein. The local oscillator distribution circuitry 1000 comprises an oscillator 1010. The oscillator 1010 provides a first signal having a wavelength λ. The oscillator 1010 may represent various elements, such as an FMCW generator a reference signal generator, a DPLL, a DCO, etc. As will be known to the person of ordinary skill in the art, the wavelength λ is related to the frequency f essentially according to the formula f=c/λ, where c is the speed of light in the medium through which the signal propagates. The speed of light will depend on the permittivity and permeability of the medium. For example, in a silicon die, if f=20 GHz, then λ=6 mm. As depicted, the oscillator 1010 provides a differential (or double ended) output. In other embodiments (not shown), the oscillator 1010 may provide a single ended (non-differential) output.

The local oscillator distribution circuitry 1000 also comprises the first splitter 1020 arranged to receive the first signal from the oscillator 1010 and provide a second signal and a third signal. The first splitter 1020 does not change the frequency or wavelength of the first signal. Accordingly, the second signal and the third signal each have the wavelength λ. As depicted, the first splitter 1020 also provides a signal to a feedback PLL 1025, to assist in normal operation of the local oscillator distribution circuitry 1000, as will be apparent to the person of ordinary skill in the art having the benefit of the present disclosure. The first splitter 1020 comprises a plurality of gain elements 1022. The structure of the gain element 1022 will be described in FIG. 10 and accompanying description below.

The local oscillator distribution circuitry 1000 also comprises a first line 1030 arranged to carry the second signal provided by the first splitter, and a second line 1040 arranged to carry the third signal provided by the first splitter. Because the second signal and third signal are double ended, the first line and the second line each comprise two conductive elements, as depicted in FIG. 10.

Desirably, the first line 1030 and the second line 1040 have lengths selected according to the wavelength(s) of the second signal and the third signal. Appropriate selection of line lengths reduces the likelihood and/or extent of matching. In one embodiment, the first line 1030 has a length from λ/4 to λ/32. In one embodiment, the second line 1040 has a length from λ/4 to λ/32.

In a further embodiment, the first line 1030 has a length from λ/8 to λ/16. In a further embodiment, the second line 1040 has a length from λ/8 to λ/16. Though not to be bound by theory, at shorter lengths (i.e., the greater the denominator x in λ/x), more repeaters will generally be required and the power consumption will generally be greater. At greater lengths (i.e., the lesser the denominator x in λ/x), fewer repeaters will generally be required, but reflections are more likely and mismatch losses will generally be higher.

In a particular embodiment, the first line 1030 has a length of λ/10 and the second line 1040 has a length of λ/10.

The local oscillator distribution circuitry 1000 further comprises a transmitter splitter 1050 arranged to receive the second signal via the first line 1030, and provide a plurality of transmitter signals. Similarly to the first splitter 1020, the transmitter splitter 1050 does not change the frequency or wavelength of the second signal. Accordingly, each transmitter signal has the wavelength λ.

The local oscillator distribution circuitry 1000 also comprises a receiver splitter 1060 arranged to receive the second signal via the second line 1040 and provide a plurality of receiver signals. Similarly to the first splitter 1020 and the transmitter splitter 1050, the receiver splitter 1060 does not change the frequency or wavelength of the second signal. Accordingly, each receiver signal has the wavelength λ.

The oscillator 1010, the first splitter 1020, the first line 1030, the second line 1040, the transmitter splitter 1050, and the receiver splitter 1060 may be considered to be components of the AD-PLL 1005.

In one embodiment, the local oscillator distribution circuitry 1000 may further comprise a plurality of third lines 1055, wherein each third line 1055 is arranged to carry one transmitter signal provided by the transmitter splitter 1050. As depicted in FIG. 10, the local oscillator distribution circuitry 1000 comprises three third lines, 1055a, 1055b, and 1055c. In other embodiments (not shown), the local oscillator distribution circuitry 1000 may comprise two, four, five, or another plural number of third lines 1055.

In one embodiment, the local oscillator distribution circuitry 1000 may further comprise a plurality of fourth lines 1065, wherein each fourth line 1065 is arranged to carry one receiver signal provided by the receiver splitter 1060. As depicted in FIG. 10, the local oscillator distribution circuitry 1000 comprises four third lines, 1065a, 1065b, 1065c, and 1065d. In other embodiments (not shown), the local oscillator distribution circuitry 1000 may comprise two, three, five, or another plural number of fourth lines 1065.

Desirably, each third line 1055 and each fourth line 1065 has a length selected according to the wavelength(s) of the transmitter signals and the receiver signals, respectively. In one embodiment, wherein each third line 1055 has a length from λ/4 to λ/32. In one embodiment, each fourth line 1065 has a length from λ/4 to λ/32.

In a further embodiment, each third line 1055 has a length from λ/8 to λ/16. In a further embodiment, each fourth line 1065 has a length from λ/8 to λ/16. In one particular embodiment, each third line 1055 has a length of λ/10 and each fourth line 1065 has a length of λ/10.

In one embodiment, the local oscillator distribution circuitry 1000 may additionally comprise a plurality of transmitter repeaters 1070, wherein each transmitter repeater 1070 is arranged to receive one transmitter signal via one third line 1055 and repeat the transmitter signal. For example, as depicted in FIG. 10, the local oscillator distribution circuitry 1000 comprises three transmitter repeaters 1070a, 1070b, and 1070c, one for each of the third lines 1055a, 1055b, and 1055c.

In one embodiment, the local oscillator distribution circuitry 1000 may also comprise a plurality of receiver repeaters 1080, wherein each receiver repeater 1080 is arranged to receive one receiver signal via one fourth line 1065 and repeat the receiver signal. For example, as depicted in FIG. 10, the local oscillator distribution circuitry 1000 comprises four receiver repeaters 1080a, 1080b, 1080c, and 1080d, one for each of the fourth lines 1065a, 1065b, 1065c, and 1065d.

The positions of transmitter repeaters 1070 and receiver repeaters 1080 in a semiconductor device having local oscillator distribution circuitry 1000 may be selected to minimize reflections and minimize signal losses.

As depicted in FIG. 10, in one embodiment, the local oscillator distribution circuitry 1000 may yet further comprise a plurality of fifth lines 1075, wherein each fifth line 1075 is arranged to carry one repeated transmitter signal provided by one transmitter repeater 1070. For example, the local oscillator distribution circuitry 1000 depicted in FIG. 10 comprises three fifth lines, 1075a, 1075b, and 1075c, of which fifth line 1075a carries the repeated transmitter signal provided by transmitter repeater 1070a, etc.

In one embodiment, the local oscillator distribution circuitry 1000 may additionally comprise a plurality of sixth lines 1085, wherein each sixth line 1085 is arranged to carry one repeated receiver signal provided by one receiver repeater 1080. For example, the local oscillator distribution circuitry 1000 depicted in FIG. 10 comprises four sixth lines, 1085a, 1085b, 1085c, and 1085d, of which sixth line 1085a carries the repeated receiver signal provided by receiver repeater 1080a, etc.

Desirably, each fifth line 1075 and each sixth line 1085 has a length selected according to the wavelength(s) of the repeated transmitter signals and the repeated receiver signals, respectively. In one embodiment, each fifth line 1075 has a length from $\lambda/4$ to $\lambda/32$. In one embodiment, each sixth line 1085 has a length from $\lambda/4$ to $\lambda/32$.

In a further embodiment, each fifth line 1075 has a length from $\lambda/8$ to $\lambda/16$. In a further embodiment, each sixth line 1085 has a length from $\lambda/8$ to $\lambda/16$. In one particular embodiment, each fifth line 1075 has a length of $\lambda/10$ and each sixth line 1085 has a length of $\lambda/10$.

The various lengths at various stages may vary. For example, in one embodiment, the first line 1030 and the second line 1040 may have a first particular length; each third line 1055 and each fourth line 1065 may have a second particular length different from the first particular length; and each fifth line 1075 and each sixth line 1085 may have a third particular length different from the first particular length, the second particular length, or both.

The lengths of one or more of the first line 1030, the second line 1040, the third lines 1055, the fourth lines 1065, the fifth lines 1075, and the sixth lines 1085 may be selected to minimize reflections and minimize signal losses.

Although FIG. 10 shows only one set of transmitter repeaters 1070 and one set of receiver repeaters 1080, the local oscillator distribution circuitry 1000 may comprise additional sets of repeaters and additional sets of lines.

In one embodiment, the local oscillator distribution circuitry 1000 may further comprise the transmitter frequency multiplier 1090 arranged to multiply a frequency of each repeated transmitter signal. For example, the transmitter frequency multiplier 1090 may be arranged to multiply the frequency of each repeated transmitter signal by 2, 3, 4, or 5. In a particular embodiment, the transmitter frequency multiplier 1090 is arranged to multiply the frequency of each repeated transmitter signal by 4. A multiplier of 4 may be desirable because such a multiplier may be provided by a digitally controlled oscillator 825 and an ADPLL 1005, which can be implemented in CMOS technologies, may function as a PLL 1025. In some embodiments, the transmitter frequency multiplier 1090 may comprise a plurality of individual frequency multipliers that are arranged in series. The output of the transmitter frequency multiplier 1090 may be provided to the transmission antenna 710. Techniques and circuits that multiply a frequency are known to the person of ordinary skill in the art or may be described in other patents or published patent applications assigned to GLOBALFOUNDRIES Inc., and need not be described further.

In one embodiment, the local oscillator distribution circuitry 1000 may additionally comprise a receiver frequency multiplier 1095 arranged to multiply a frequency of each repeated receiver signal. For example, the receiver frequency multiplier 1095 may be arranged to multiply the frequency of each repeated receiver signal by 2, 3, 4, or 5. In one particular embodiment, the receiver frequency multiplier 1095 is arranged to multiply the frequency of each repeated receiver signal by 4. In some embodiments, the receiver frequency multiplier 1095 may comprise a plurality of individual frequency multipliers that are arranged in series. The output of the receiver frequency multiplier 1095 may be provided to the mixer 860.

Signals outputted by transmitter frequency multiplier 1090 may be provided to an array of transmitter antennas. Signals outputted by receiver frequency multiplier 1095 may be provided to an array of receiver antennas.

In one example, a semiconductor device having local oscillator distribution circuitry 1000 having three transmitters, four receivers, three transmitter repeaters 1070, and four receiver repeaters 1080 consumes only 170 mW, which is far less than the over 1.6 W consumed by the prior art circuitry referred to in the background.

FIG. 11 depicts a gain element 1022, in accordance with embodiments herein. The depicted gain element 1022 comprises a first circuit 1100a. The first circuit 1100a comprises a capacitor 1110a. The first circuit 1100a also comprises a resistor 1120a, a first transistor 1130a, and a second transistor 1140a in parallel. One of the first transistor 1130a and the second transistor 1140a is an NMOS transistor, and the other of the first transistor 1130a and the second transistor 1140a is a PMOS transistor.

The gain element 1022 also comprises a second circuit 1100b. The second circuit 1100b comprises a capacitor 1110b. The second circuit 1100b also comprises a resistor 1120b, a first transistor 1130b, and a second transistor 1140b in parallel. One of the first transistor 1130b and the second transistor 1140b is an NMOS transistor, and the other of the first transistor 1130b and the second transistor 1140b is a PMOS transistor.

In one embodiment, each first transistor 1130a, 1130b is the PMOS transistor of its circuit 1100a, 1100b and each second transistor 1140a, 1140b is the NMOS transistor of its circuit 1100a, 1100b.

As depicted in FIG. 11, in the gain element 1022, the first circuit 1100a further comprises a first back gate voltage source 1135a and a second back gate voltage source 1145a. The second circuit 1100b further comprises a first back gate voltage source 1135b and a second back gate voltage source 1145b. In other words, each first transistor 1130a, 1130b is arranged to receive a first back gate voltage and each second transistor 1140a, 1140b is arranged to receive a second back gate voltage.

In one embodiment, the first back gate voltage and the second back gate voltage may be adjustable, either in tandem within one circuit 1100, independently from each other within one circuit 1100, in tandem across both circuits 1100a and 1100b (i.e., for example, both the first back gate voltage source 1135a and the second back gate voltage source 1135b may provide the same voltage to the back gates of first transistors 1130a and 1130b), or completely independently (i.e., each of the four transistors 1130a, 1130b, 1140a, and 1140b may have its back gate voltage adjusted independently of the back gate voltages of the other three transistors). By adjusting one or both of the first back gate voltage and the second back gate voltage of one or both circuits 1100a and 1100b, the gain imparted by the gain element 1022 may be adjusted. This may allow convenient and/or energy-efficient adjustment of gain to a desired value before and/or during operation of a device comprising gain element 1022.

In another embodiment, the first back gate voltage and the second back gate voltage may be fixed, either at the same value or at different values. For example, in one embodiment, each NMOS transistor may be arranged to receive a back gate voltage of 0.8 V and each PMOS transistor may be arranged to receive a back gate voltage of 0 V.

Although FIG. 11 depicts a double ended gain element 1022, a single ended gain element having one circuit 1100 is also in accordance with embodiments herein.

The gain element 1022 may be operated with a number of parameters. A current of about 2.5 mA may allow a differential voltage gain of 4 dB when the signal frequency input to the gain element 1022 is 20 GHz. Also, the gain may be adjusted by varying the supply voltage, the back gate voltage to the first transistors 1130a, 1130b, the back gate voltage to the second transistors 1140a, 1140b, or two or more thereof. The first and second transistors 1130a, 1130b, 1140a, and 1140b may be biased at any desirable level. For example, the transistors may be biased close to peak cut-off frequency (fT). Though not to be bound by theory, high frequency circuits generally require technologies with higher fT for optimal function. It is desirable to bias the devices in mm-wave circuits at current densities to operate at peak fT. In one embodiment, the first and second transistors 1130a, 1130b, 1140a, and 1140b are biased at 200 µA/µm.

FIG. 12 depicts a splitter 1200. The splitter 1200 comprises a first gain element 1210 in series with a plurality of second gain elements 1220, wherein the plurality of second gain elements are in parallel. Although FIG. 12 depicts three second gain elements 1220a, 1220b, and 1220c, in embodiments herein, the splitter 1200 may comprise two, four, five, or another plural number of second gain elements 1220.

The first gain element 1210 may be as described above regarding gain element 1022 depicted in FIG. 10. Each second gain element 1220 may also be as described above regarding gain element 1022 depicted in FIG. 10. For example, each first transistor of each circuit of each of the first gain element and the plurality of the second gain elements may be arranged to receive first back gate voltages and the second transistor of each circuit of each of the first gain element and the plurality of the second gain elements may be arranged to receive second back gate voltages. The back gate voltage of each transistor may be adjusted independently or in tandem with any one or more other transistors' back gate voltages. For another example, each first transistor of each circuit of each gain element may be a PMOS transistor and each second transistor of each circuit of each gain element may be an NMOS transistor.

Although FIG. 12 depicts a single ended splitter 1200, this is for convenience only. A double ended splitter wherein the first gain element 1210 and each second gain element 1220 has two circuits 1100a, 1100b is also in accordance with embodiments herein.

Figure 13:
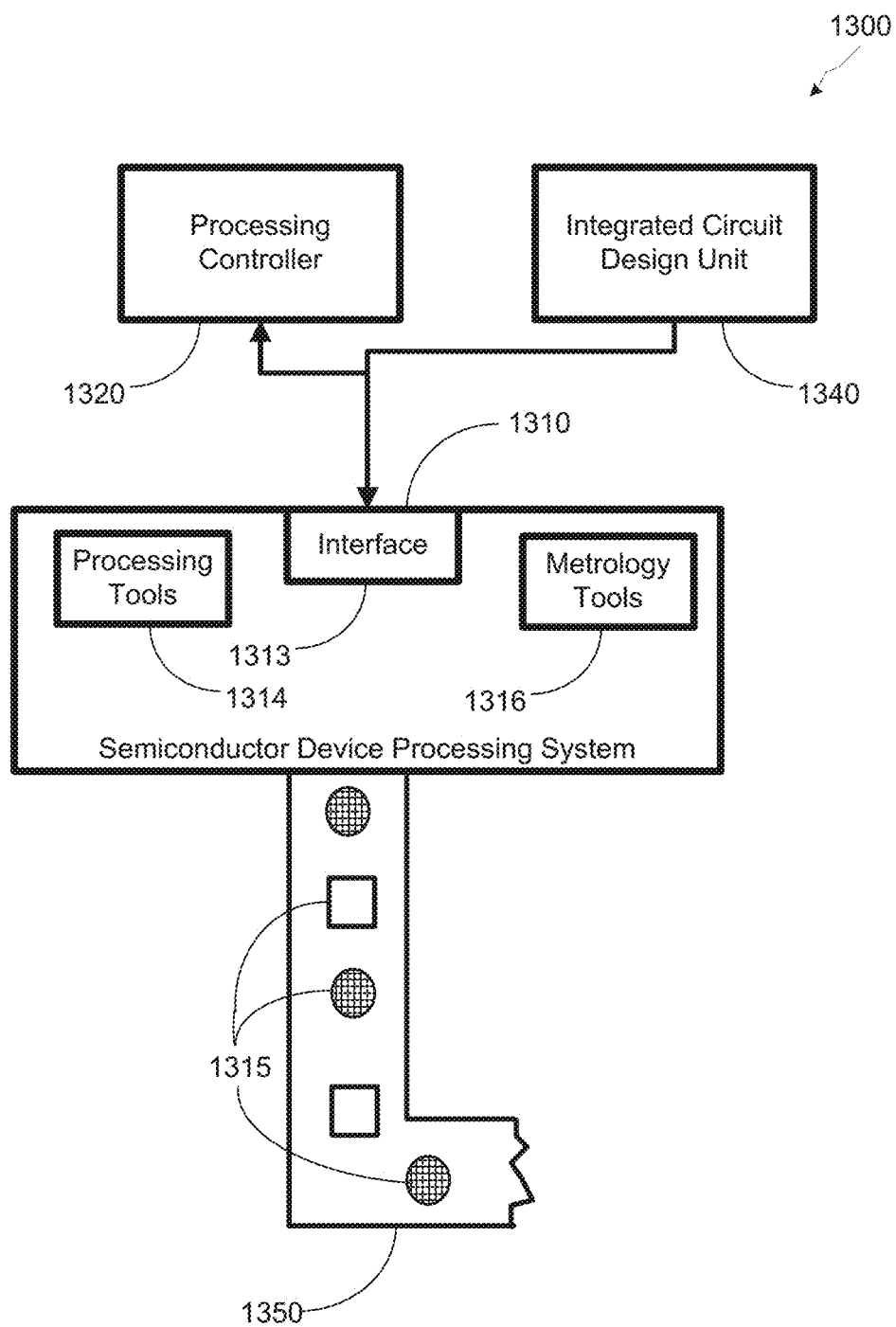
FIG. 13 illustrates a stylized depiction of a system for fabricating a semiconductor device, in accordance with embodiments herein.

Turning now to FIG. 13, a stylized depiction of a system 1300 for fabricating a semiconductor device package having a local oscillator distribution circuitry 800, in accordance with embodiments herein, is illustrated. A system 1300 of FIG. 13 may comprise a semiconductor device processing system 1310 and an integrated circuit design unit 1340. The semiconductor device processing system 1310 may manufacture integrated circuit devices based upon one or more designs provided by the integrated circuit design unit 1340.

The semiconductor device processing system 1310 may comprise various processing stations, such as etch process stations, photolithography process stations, CMP process stations, etc. Each of the processing stations may comprise one or more processing tools 1314 and or metrology tools 1316. Feedback based on data from the metrology tools 1316 may be used to modify one or more process parameters used by the processing tools 1314 for performing process steps.

The semiconductor device processing system 1310 may also comprise an interface 1312 that is capable of providing communications between the processing tools 1314, the metrology tools 1316, and a controller, such as the processing controller 1320. One or more of the processing steps performed by the semiconductor device processing system 1310 may be controlled by the processing controller 1320. The processing controller 1320 may be a workstation computer, a desktop computer, a laptop computer, a tablet computer, or any other type of computing device having one or more software products that are capable of controlling processes, receiving process feedback, receiving test results data, performing learning cycle adjustments, performing process adjustments, etc.

The semiconductor device processing system 1310 may produce integrated circuits (e.g., semiconductor devices having local oscillator distribution circuitry 800) on a medium, such as silicon wafers. More particularly, in one embodiment, the semiconductor device processing system 1310 may produce a gain element, having: a first circuit having: a capacitor; a resistor in series with the capacitor; and a first transistor in series with a second transistor; wherein the first transistor and the second transistor are in parallel with the resistor, one of the first transistor and the second transistor is an NMOS transistor, and the other of the first transistor and the second transistor is a PMOS transistor; and a second circuit having: a capacitor; a resistor in series with the capacitor; and a first transistor in series with a second transistor; wherein the first transistor and the second transistor are in parallel with the resistor, one of the first transistor and the second transistor is an NMOS transistor, and the other of the first transistor and the second transistor is a PMOS transistor.

In another embodiment, the semiconductor device processing system 1310 may produce a splitter, having: a first gain element in series with a plurality of second gain elements, wherein the plurality of second gain elements are in parallel; wherein the first gain element and each second gain element each comprise: a first circuit having: a capacitor; a resistor in series with the capacitor; and a first transistor in series with a second transistor; wherein the first transistor and the second transistor are in parallel with the resistor, one of the first transistor and the second transistor is an NMOS transistor, and the other of the first transistor and the second transistor is a PMOS transistor; and a second circuit having: a capacitor; a resistor in series with the capacitor; and a first transistor in series with a second transistor; wherein the first transistor and the second transistor are in parallel with the resistor, one of the first transistor and the second transistor is an NMOS transistor, and the other of the first transistor and the second transistor is a PMOS transistor.

In yet another embodiment, the semiconductor device processing system 1310 may produce a semiconductor device, having: an oscillator arranged to provide a first signal having a wavelength $\lambda$; a first splitter arranged to receive the first signal and provide a second signal and a third signal, wherein the second signal and the third signal each have the wavelength $\lambda$; a first line arranged to carry the second signal provided by the first splitter; a second line arranged to carry the third signal provided by the first splitter; a transmitter splitter arranged to receive the second signal via the first line and provide a plurality of transmitter signals, wherein each transmitter signal has the wavelength $\lambda$; and a receiver splitter arranged to receive the second signal via the second line and provide a plurality of receiver signals, wherein each receiver signal has the wavelength $\lambda$; wherein the first line has a length from $\lambda/4$ to $\lambda/32$ and the second line has a length from $\lambda/4$ to $\lambda/32$. The first splitter, the transmitter splitter, and the receiver splitter may each be a splitter referred to above. The semiconductor device may also comprise one or more repeaters, wherein each repeater may be a gain element referred to above.

The production of integrated circuits by the semiconductor device processing system 1310 may be based upon the circuit designs provided by the integrated circuit design unit 1340. The semiconductor device processing system 1310 may provide processed integrated circuits/devices 1315 on a transport mechanism 1350, such as a conveyor system. In some embodiments, the conveyor system may be sophisticated clean room transport systems that are capable of transporting semiconductor wafers. In one embodiment, the semiconductor device processing system 1310 may comprise a plurality of processing steps, e.g., the $1^{st}$ process step, the $2^{nd}$ process step, etc., as described above.

In some embodiments, the items labeled "1215" may represent individual wafers, and in other embodiments, the items 1315 may represent a group of semiconductor wafers, e.g., a "lot" of semiconductor wafers. The integrated circuit or device 1315 may comprise a transistor, a capacitor, a resistor, a memory cell, a processor, and/or the like.

The integrated circuit design unit 1340 of the system 1300 is capable of providing a circuit design that may be manufactured by the semiconductor device processing system 1310. This may include information regarding the components of the local oscillator distribution circuitry 800 described above.

The integrated circuit design unit 1340 may be capable of determining the number of devices (e.g., processors, memory devices, etc.) to place in a device package. Based upon such details of the devices, the integrated circuit design unit 1340 may determine specifications of the devices that are to be manufactured. Based upon these specifications, the integrated circuit design unit 1340 may provide data for manufacturing a semiconductor device package described herein.

The system 1300 may be capable of performing analysis and manufacturing of various products involving various technologies. For example, the system 1300 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 1300 to fabricate semiconductor devices described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   providing, to a transmitter splitter, a first signal having a wavelength $\lambda$;
   providing, to a receiver splitter, a second signal having the wavelength $\lambda$;
   providing, by the transmitter splitter, a plurality of transmitter signals, wherein each of the transmitter signals has the wavelength $\lambda$; and
   providing, by the receiver splitter, a plurality of receiver signals, wherein each of the receiver signals has the wavelength $\lambda$;
   wherein the first signal is provided over a first line having a length of $\lambda/X$, wherein X is an integer from 4 to 32, inclusive; the second signal is provided over a second line having a length of $\lambda/Y$, wherein Y is an integer from 4 to 32, inclusive; or both.

2. The method of claim 1, wherein:
   the length of the first line is from $\lambda/8$ to $\lambda/16$, and
   the length of the second line is from $\lambda/8$ to $\lambda/16$.

3. The method of claim 2, wherein:
   the length of the first line is about $\lambda/10$; and
   the length of the second line is about $\lambda/10$.

4. The method of claim 1, further comprising adjusting a gain of at least one of the first signal or the second signal, wherein adjusting the gain comprises adjusting a back gate voltage of at least one transistor of at least one of the transmitter splitter and the receiver splitter.

5. The method of claim 1, further comprising:
   receiving, by a first splitter, an input signal having a wavelength $\lambda$, and
   splitting, by the first splitter, the input signal to provide the first signal and the second signal.

6. The method of claim 5, further comprising adjusting a gain of the input signal, wherein adjusting the gain comprises adjusting a back gate voltage of at least one transistor of the first splitter.

7. The method of claim 5, further comprising at least one of:
   providing, by an oscillator, the input signal; or
   receiving, by a phase lock loop, a reference signal and a frequency modulated continuous wave (FMCW) signal, and providing, by the phase lock loop, the input signal, wherein the input signal is phase locked.

8. The method of claim 1, further comprising:
   carrying, by each of a plurality of third lines, one transmitter signal provided by the transmitter splitter, wherein each third line has a length of $\lambda/Z$, wherein Z is an integer from 4 to 32, inclusive;
   carrying, by each of a plurality of fourth lines, one receiver signal provided by the receiver splitter, wherein each fourth line has a length of $\lambda/W$, wherein W is an integer from 4 to 32, inclusive;
   repeating, by each of a plurality of transmitter repeaters, the one transmitter signal carried by a one of the third lines; and
   repeating, by each of a plurality of receiver repeaters, the one receiver signal carried by a one of the fourth lines.

9. The method of claim 8, further comprising adjusting a gain of at least one transmitter signal or at least one receiver signal, wherein adjusting the gain comprises adjusting a back gate voltage of at least one transistor of at least one of the transmitter splitter, the receiver splitter, the transmitter repeaters, or the receiver repeaters.

10. The method of claim 8, further comprising:
    carrying, by each of a plurality of fifth lines, one transmitter signal provided by one of the plurality of transmitter repeaters, wherein each fifth line has a length of $\lambda/V$, wherein V is an integer from 4 to 32, inclusive;
    carrying, by each of a plurality of sixth lines, one receiver signal provided by one of the plurality of receiver repeaters, wherein each sixth line has a length of $\lambda/U$, wherein U is an integer from 4 to 32, inclusive;
    multiplying, by a transmitter frequency multiplier, a frequency of each of the transmitter signals carried by the plurality of fifth lines; and multiplying, by a receiver frequency multiplier, a frequency of each of the receiver signals carried by the plurality of sixth lines;
wherein each of the fifth lines has a length from $\lambda/4$ to $\lambda/32$ and each of the sixth lines has a length from $\lambda/4$ to $\lambda/32$.

11. The method of claim 10, wherein multiplying, by the transmitter frequency multiplier, is by 2, 3, 4, or 5, and multiplying, by the receiver frequency multiplier, is by 2, 3, 4, or 5.

12. The method of claim 1, wherein providing, by the transmitter splitter, comprises providing three transmitter signals, and providing, by the receiver splitter, comprises providing four receiver signals.

13. A method, comprising:
providing, by a phase lock loop, a first millimeter-wave (mm-wave) signal having a wavelength, $\lambda$;
receiving, by a first splitter, the first signal;
providing, by the first splitter, a first transmit signal on a first transmit line, and a first receive signal on a first receive line, wherein the first transmit signal and the first receive signal each have the wavelength $\lambda$;
receiving, by a transmitter splitter, the first transmit signal;
providing, by the transmitter splitter, a second transmit signal on a second transmit line and a third transmit signal on a third transmit line, wherein the second and third transmit signals each have the wavelength $\lambda$; and
receiving, by a receiver splitter, the first receive signal; and
providing, by the receiver splitter, a second receive signal on a second receive line and a third receive signal on a third receive line, wherein the second and third receive signals each have the wavelength $\lambda$;
wherein at least one of the following conditions is true:
the first transmit line has a length of $\lambda/X$, wherein X is an integer from 4 to 32, inclusive;
the first receive line has a length of $\lambda/Y$, wherein Y is an integer from 4 to 32, inclusive;
the second transmit line has a length of $\lambda/Z$, wherein Z is an integer from 4 to 32, inclusive;
the third transmit line has a length of $\lambda/W$, wherein W is an integer from 4 to 32, inclusive;
the second receive line has a length of $\lambda/V$, wherein V is an integer from 4 to 32, inclusive; or
the third receive line has a length of $\lambda/U$, wherein U is an integer from 4 to 32, inclusive.

14. The method of claim 13, further comprising adjusting a gain of at least one signal, wherein adjusting the gain comprises adjusting a back gate voltage of at least one transistor of at least one of the first splitter, the transmitter splitter, and the receiver splitter.

15. A method, comprising:
adjusting a gain of a splitter comprising (I) at least one gain element, the gain element comprising: (A) a first circuit comprising (i) a capacitor; and (ii) a resistor, a first transistor, and a second transistor in parallel; wherein one of the first transistor and the second transistor is an NMOS transistor, and the other of the first transistor and the second transistor is a PMOS transistor; and (B) a second circuit comprising (i) a capacitor; and (ii) a resistor, a third transistor, and a fourth transistor in parallel; wherein one of the third transistor and the fourth transistor is an NMOS transistor, and the other of the third transistor and the fourth transistor is a PMOS transistor;
wherein adjusting the gain comprises adjusting a first back gate voltage of at least one of the first transistor and the third transistor; adjusting a second back gate voltage of at least one of the second transistor and the fourth transistor; or both.

* * * * *